United States Patent
Hamasaki et al.

(10) Patent No.: US 8,587,130 B2
(45) Date of Patent: Nov. 19, 2013

(54) DIE-SORTING SHEET AND METHOD FOR TRANSPORTING CHIPS HAVING ADHESIVE LAYER

(75) Inventors: Akie Hamasaki, Tokyo (JP); Shino Moritani, Tokyo (JP); Mikio Komiyama, Tokyo (JP)

(73) Assignee: Lintec Corporation, Tokyo (JP)

( * ) Notice: Subject to any disclaimer, the term of this patent is extended or adjusted under 35 U.S.C. 154(b) by 57 days.

(21) Appl. No.: 12/446,117

(22) PCT Filed: Oct. 12, 2007

(86) PCT No.: PCT/JP2007/069958
§ 371 (c)(1),
(2), (4) Date: Apr. 17, 2009

(87) PCT Pub. No.: WO2008/047708
PCT Pub. Date: Apr. 24, 2008

(65) Prior Publication Data
US 2010/0311226 A1    Dec. 9, 2010

(30) Foreign Application Priority Data
Oct. 20, 2006  (JP) .................. 2006-286651

(51) Int. Cl.
*H01L 21/78*   (2006.01)
*B32B 3/02*    (2006.01)
*C09J 7/02*    (2006.01)

(52) U.S. Cl.
USPC ........................................ 257/777; 438/464

(58) Field of Classification Search
CPC ............... H01L 21/78; B32B 3/02; C09J 7/02
USPC .................................... 438/464; 257/E21.599
See application file for complete search history.

(56) References Cited

U.S. PATENT DOCUMENTS

| 5,110,388 A | 5/1992 | Komiyama et al. |
| 5,118,567 A | 6/1992 | Komiyama et al. |
| 6,139,953 A * | 10/2000 | Nagamoto et al. ............ 428/343 |
| 6,753,614 B2 | 6/2004 | Yamazaki et al. |
| 2006/0216452 A1* | 9/2006 | Tomita et al. ................. 428/40.1 |
| 2007/0166510 A1* | 7/2007 | Kato et al. .................... 428/137 |

FOREIGN PATENT DOCUMENTS

| JP | 2032181 A | 2/1990 |
| JP | 2000095291 A | 4/2000 |
| JP | 2000327070 A | 11/2000 |
| JP | 2002299389 A | 10/2002 |
| JP | 2005-281418 | * 10/2005 |
| JP | 2005-322853 | * 11/2005 |
| WO | WO 2005/083023 | * 9/2005 |

* cited by examiner

*Primary Examiner* — Walter H Swanson
(74) *Attorney, Agent, or Firm* — The Webb Law Firm

(57) ABSTRACT

A die-sorting sheet includes a pressure-sensitive adhesive layer exposed on an outer periphery of the carrier sheet, and a base film exposed on a central area that is inside the outer periphery. A method for transporting a chip having an adhesive layer includes the steps of: providing the above die-sorting sheet that is fixed with a frame through the pressure-sensitive adhesive layer on the outer periphery; temporarily attaching a picked up chip through an adhesive layer thereof onto the base film exposed on the die-sorting sheet; and transporting the die-sorting sheet to a subsequent step while the chip is temporarily attached on the sheet through the adhesive layer.

13 Claims, 6 Drawing Sheets

DIE-SORTING SHEET AND METHOD FOR TRANSPORTING CHIPS HAVING ADHESIVE LAYER

FIELD OF THE INVENTION

The present invention relates to die-sorting sheets and methods for transporting chips having an adhesive layer. In more detail, the invention relates to die-sorting sheets on which chips having an adhesive layer may be temporarily attached, and methods for transporting chips having an adhesive layer with the die-sorting sheets.

The manufacturing of semiconductor devices involves a dicing step in which a semiconductor wafer provided with circuits through necessary preprocessing is cut and separated into chips. In this step, a dicing sheet for fixing the semiconductor wafer is attached to a circular or square frame called a ring frame; and the semiconductor wafer is attached to the dicing sheet and diced with respect to each circuit to manufacture semiconductor chips. The dicing step is followed by an expanding step with a bonding machine and a die-bonding step wherein a die-bonding adhesive such as an epoxy resin is applied to pads on substrates and the semiconductor chips are bonded onto the substrates. Further, the chips are subjected to a wire-bonding step and an inspection step and are finally encapsulated with a resin in a molding step, whereby semiconductor devices are manufactured.

Meanwhile, individualized semiconductor chips are often accommodated and transported without being die-bonded. In this case, the die-bonding step is performed off line.

For the accommodation and transportation of semiconductor chips, a reeled embossed carrier tape or chip tray produced by embossing a thermoplastic resin sheet with recessed pockets is used. The semiconductor chips are placed in the recessed pockets and covered with a cover sheet, and the chips are stored and transported until they are mounted on electronic devices. The use of such embossed carrier tapes permits selective shipment of non-defective products after the dicing step, or allows semiconductor chips from a single wafer to be shipped to separate factories.

Since dusts and contamination can cause failures in semiconductor devices, semiconductor chips transported to facilities are often cleaned with water before use. To perform cleaning, it is necessary that the chips collected from the embossed carrier tapes should be re-fixed on a dicing tape or the like, and this causes significant inefficiency.

Patent Document 1 discloses a technique wherein semiconductor chips are accommodated and transported while being mounted on a pressure-sensitive adhesive tape such as a heat-removable tape or a general dicing tape. In this case, the semiconductor chips are attached to a pressure-sensitive adhesive layer of the adhesive tape.

As described hereinabove, the embossed carrier tapes or general dicing tapes are used to accommodate and transport semiconductor chips before the die-bonding step, that is, the semiconductor chips do not have an adhesive on the back surface thereof yet.

Because applying an adhesive at the time of die-bonding increases complexity, Patent Document 2 discloses a dicing sheet that has an adhesive layer functioning as both a wafer-fixing pressure-sensitive adhesive and a die-bonding adhesive. The adhesive layer is applied to a back surface of a wafer prior to the dicing step and is diced to a chip size together with the wafer. When the chip is picked up, the adhesive layer is held on the back surface of the chip.
Patent Document 1: JP-A-2000-95291
Patent Document 2: JP-A-H02-32181

SUMMARY OF THE INVENTION

The above adhesive layer has a certain level of tackiness (adhesion) required to fix the wafer (chips) during the dicing step. When the semiconductor chips with tackiness on the back surface are accommodated in the embossed carrier, they adhere to the embossed carrier because of the tackiness. It is therefore difficult to collect the semiconductor chips from the recessed pockets in the subsequent step. Further, collecting the chips results in deformation of the adhesive layer on the back surface. Such semiconductor chips reduce the reliability of the obtainable semiconductor devices.

Further, when the above semiconductor chips are accommodated on a general dicing tape, the adhesive layer of the semiconductor chips firmly attaches to the pressure-sensitive adhesive of the dicing tape to make the picking up in the subsequent step difficult. Further, when the chips are picked up, the adhesive layer on the chip back surface can be contaminated by the pressure-sensitive adhesive of the dicing tape that remains attached thereto. This contamination also reduces the reliability of the obtainable semiconductor devices.

The problems mentioned above are not limited to chips from semiconductor wafers but are also probable with any chip products such as optical chips.

It is therefore an object of the present invention to provide die-sorting sheets whereby even chips having a tacky adhesive layer on the back surface can be stably accommodated and transported, and methods for stably accommodating and transporting such chips having an adhesive layer by the use of the die-sorting sheets.

The present inventors diligently studied and have invented specific die-sorting sheets that can solve the above problems. The present invention has been thus completed.

A die-sorting sheet according to the present invention on which a chip having an adhesive layer is temporarily attached comprises a pressure-sensitive adhesive layer exposed on an outer periphery of the die-sorting sheet, and a base film exposed on a central area that is inside the outer periphery.

In the die-sorting sheet, the pressure-sensitive adhesive layer is preferably laminated on an outer periphery of the base film.

Preferably, the pressure-sensitive adhesive layer is laminated on a support film and is shaped identically with the support film, and the base film is laminated on a central area of the pressure-sensitive adhesive layer.

A method for transporting a chip having an adhesive layer according to the present invention comprises:

applying a dicing and die-bonding adhesive sheet to a surface of a substrate, the adhesive sheet comprising an adhesive layer and a base material;

full-cut dicing the substrate with respect to chips together with the adhesive layer;

picking up a chip having the adhesive layer on the back surface thereof, from the base material;

providing the die-sorting sheet of the invention that is fixed with a frame through the pressure-sensitive adhesive layer on the outer periphery;

temporarily attaching the picked up chip through the adhesive layer thereof onto the base film exposed on the die-sorting sheet; and transporting the die-sorting sheet to a subsequent step while the chip is temporarily attached on the sheet through the adhesive layer.

In a preferred embodiment of the method for transporting a chip having an adhesive layer, a plurality of the chips are temporarily attached to the base film exposed on the die-sorting sheet while the respective adhesive layers are separate from one another.

ADVANTAGES OF THE INVENTION

According to the methods of the present invention, even chips having an adhesive layer can be stably accommodated and transported on the die-sorting sheets. In subsequent steps after the accommodation and transportation, the chips that are temporarily attached on the die-sorting sheets can be picked up without contamination or deformation of the adhesive layer of the chips. Accordingly, highly reliable semiconductor devices may be manufactured using the chips that are picked up.

DESCRIPTION OF THE PREFERRED EMBODIMENTS OF THE INVENTION

The present invention will be described in detail hereinbelow.

[Die-Sorting Sheets]

Die-sorting sheets according to the present invention are used to temporarily attach thereon a chip having an adhesive layer for the purpose of transportation or the like. A pressure-sensitive adhesive layer is exposed on an outer periphery of the die-sorting sheet, and a base film is exposed on a central area that is inside the outer periphery.

Figure 1:
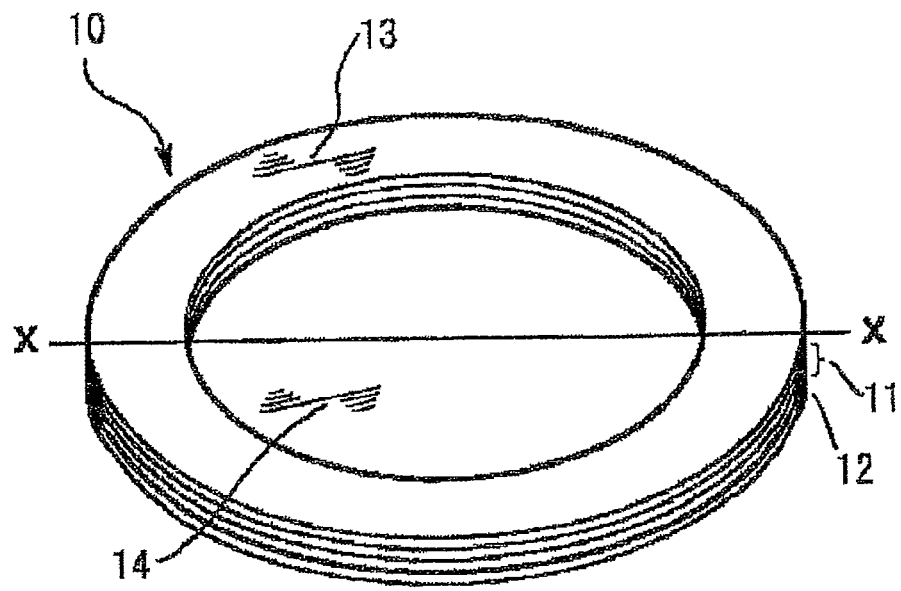
FIG. 1 is a perspective view of a die-sorting sheet according to the present invention.
Figure 2:
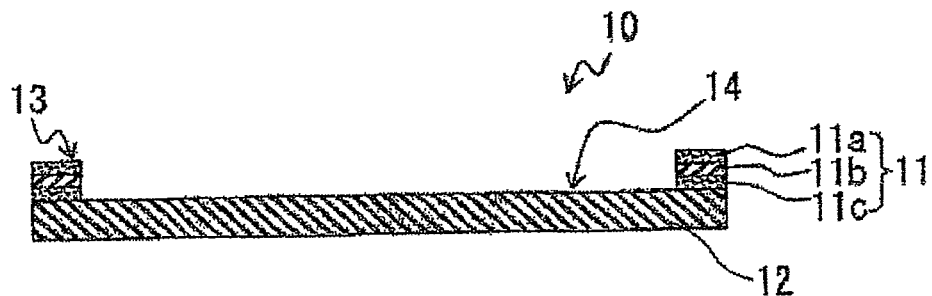
FIG. 2 is a cross sectional view taken on line X-X of FIG. 1.

A preferred embodiment of the die-sorting sheets is illustrated in a perspective view and a cross sectional view in FIGS. 1 and 2, respectively, wherein a die-sorting sheet 10 has a pressure-sensitive adhesive layer 11 laminated on an outer periphery of a base film 12. As shown, the pressure-sensitive adhesive layer 11 is exposed on an outer periphery 13 of the die-sorting sheet 10, and the base film 12 is exposed on a central area 14 that is inside the outer periphery.

The base films 12 are not particularly limited, but resin films may be used with examples including polyethylene films, polypropylene films, polyvinyl chloride films, ethylene/vinyl acetate copolymer films, ethylene/(meth)acrylic acid copolymer films, ethylene/(meth)acrylate copolymer films, polyethylene terephthalate films and polyurethane films.

The thickness of the base film 12 is preferably 10 to 1000 µm, and more preferably 20 to 800 µm.

The surface tension on the surface of the base film 12 on which chips will be mounted is preferably not more than 40 mN/m, and more preferably not more than 35 mN/m. The surface tension is preferably not less than 20 mN/m. In the use of the die-sorting sheet 10, a chip having an adhesive layer is temporarily attached to the base film through the adhesive layer. The base films having the above surface tension permit stable accommodation and transportation of the chips. Further, the base films permit high releasability of the adhesive layer of the semiconductor chips therefrom, and the chips may be easily picked up in the subsequent step. Furthermore, the base film covers the entire surface of the adhesive layer to prevent the adhesive layer from any contamination, and the enhanced releasability prevents the adhesive layer from being deformed in a removing operation. Accordingly, semiconductor devices with high reliability may be manufactured.

The above surface tension of the base films 12 may be achieved by appropriately selecting materials or by release treatments such as coating the surface of resin films with agents such as silicone resins.

The pressure-sensitive adhesive layer 11 may be a double-sided pressure-sensitive adhesive sheet as illustrated in FIG. 2 wherein pressure-sensitive adhesive layers 11a and 11c are provided on both surfaces of a core film 11b. The double-sided pressure-sensitive adhesive sheet is attached and fixed to a ring frame 50 through the pressure-sensitive adhesive layer 11a, and is bonded and integrated with the base film 12 through the pressure-sensitive adhesive layer 11c. Because the levels of adhesion required for accommodation, transportation or picking up of the chips are varied, the use of the double-sided pressure-sensitive adhesive sheet provides an advantage that pressure-sensitive adhesive layers (11a and 11c) each having appropriate adhesion may be selected.

Figure 10:
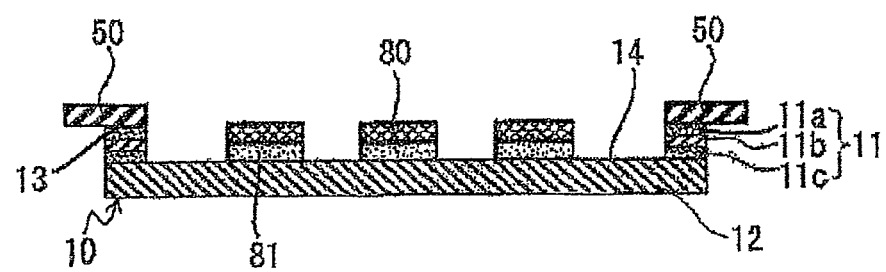
FIG. 10 is a view for explaining a method for transporting a chip having an adhesive layer according to the present invention.

The pressure-sensitive adhesive layer 11 has such a size that it may be fixed to a ring frame 50 used in the transporting methods of the present invention. The ring frame 50 is generally a metal or plastic shaped product. Needless to say, an opening 51 of the ring frame 50 has an inner diameter that is somewhat larger than the exposed central area of the base film on which semiconductor chips will be temporarily attached. (See FIG. 6.) Part of the outer periphery of the ring frame 50 is cut away to provide a flat notch 52 for a guide. In the transporting methods of the invention as will be described later, the under surface of the ring frame 50 is attached to the pressure-sensitive adhesive layer 11 of the die-sorting sheet 10 (FIG. 10). In the present specification, the surface that is to be attached to the pressure-sensitive adhesive layer 11 is referred to as the "planned surface that is to be attached to the die-sorting sheet". Back to the description of the size of the pressure-sensitive adhesive layer 11, the pressure-sensitive adhesive layer 11 has such a size that it may be fixed to the planned surface 53 that is to be attached to the die-sorting sheet, of the ring frame 50. In detail, the outer diameter of the pressure-sensitive adhesive layer 11 should be larger than the diameter of the opening 51.

The core films 11b maybe resin films similar to the base films 12. The use of relatively rigid films such as polyethylene terephthalate films provides good dimensional stability during the production of the die-sorting sheets 10.

The thickness of the core films 11b is preferably 10 to 500 μm, and more preferably 30 to 200 μm.

The pressure-sensitive adhesive layers 11a and 11c may be formed from acrylic pressure-sensitive adhesives, rubber based pressure-sensitive adhesives, silicone based pressure-sensitive adhesives or emulsion pressure-sensitive adhesives. Of these, acrylic pressure-sensitive adhesives are preferred. The pressure-sensitive adhesive layers 11a and 11c may be formed from an identical pressure-sensitive adhesive. In a preferred embodiment, the pressure-sensitive adhesive layer 11c that faces to the base film 12 is formed from a pressure-sensitive adhesive having stronger adhesion, and the pressure-sensitive adhesive layer 11a that attaches to the ring frame 50 is made of a removable pressure-sensitive adhesive.

The pressure-sensitive adhesive layers 11a and 11c each preferably range in thickness from 1 to 100 μm, and more preferably 3 to 80 μm.

The die-sorting sheets 10 of the present invention maybe produced as follows.

A double-sided pressure-sensitive adhesive sheet as a pressure-sensitive adhesive layer 11 is provided while release films treated with a silicone releasing agent or the like are disposed on both surfaces of the adhesive sheet. When pressure-sensitive adhesive layers 11a and 11c of the double-sided pressure-sensitive adhesive sheet are formed from differing pressure-sensitive adhesives, a lightly removable release film is disposed on the pressure-sensitive adhesive layer 11c that laminates to a base film 12 and a release film of heavy release type is disposed on the pressure-sensitive adhesive layer 11a that adheres to a ring frame 50. The lightly removable release film is released first. Such differing levels of removability of the lightly and heavily removable release films enhance workability during the production of the die-sorting sheets 10.

Before the pressure-sensitive adhesive layer 11 is laminated on the base film 12, it is cut to an approximately circular shape by punching or the like. In an embodiment, the pressure-sensitive adhesive layer 11 and the lightly removable release film are selectively punched out but the heavily removable release film is not completely punched out, whereby the heavily removable release film is used as a carrier of the pressure-sensitive adhesive layer 11 and the subsequent processing may be carried out continuously roll to roll.

Next, the remaining lightly removable release film and the punched-out inner circular part of the pressure-sensitive adhesive layer 11 are released and removed, and the pressure-sensitive adhesive layer is laminated on the base film 12.

Subsequently, an outer peripheral portion of the pressure-sensitive adhesive layer 11 is punched out substantially concentrically with the inner circular part of the layer 11 that has been cut away and so as to meet the diameter of the ring frame 50 that will be attached thereto. In this case too, it is preferable that the heavily removable release film is not punched out. In detail, referring to FIGS. 1 and 2, outer peripheral portions of the base film 12 and the pressure-sensitive adhesive layer 11 are cut and removed beforehand to meet the diameter of the ring frame 50. This preliminary cutting to the shape of the ring frame 50 enables eliminating a step of cutting the die-sorting sheet 10 when the die-sorting sheet 10 is attached to the ring frame 50. The die-sorting sheets 10 may be manufactured as described above.

Figure 6:
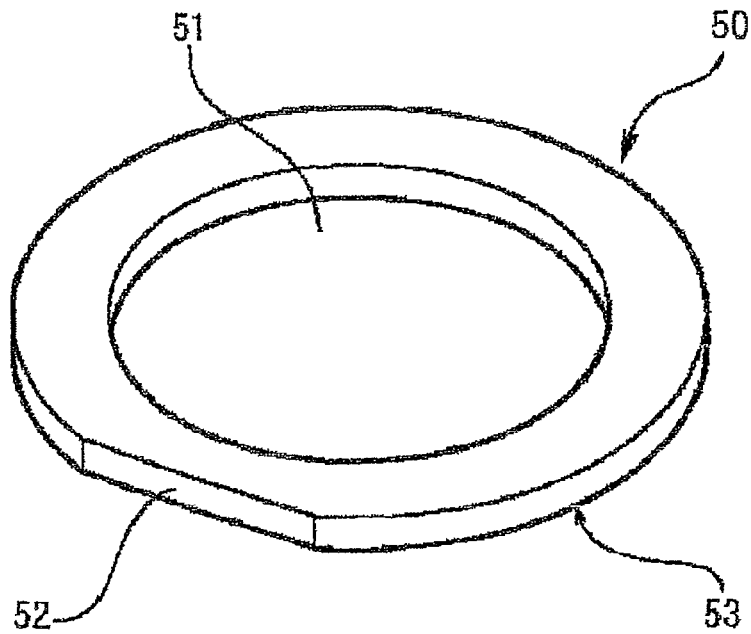
FIG. 6 is a perspective view of a ring frame.

In the transporting methods of the present invention as will be described later, the frames are not limited to the ring frame 50 shown in FIG. 6 and conventional frames with various shapes may be used. Therefore, the die-sorting sheets of the present invention are not limited to the shapes as illustrated in FIGS. 1 and 2 and may have shapes corresponding to the frames. For example, when the frame is square, the die-sorting sheet may be square too. Further, the shape of the central area 14 of the die-sorting sheet 10 may have any optional shape, in other words, the shape of the adhesive layer 11 to be removed may have any optional shape.

The pressure-sensitive adhesive layer may be composed of a single or two adhesive layers without a core film. The absence of the core films leads to smaller thickness of the pressure-sensitive adhesive layer and reduces the step height in the die-sorting sheets. It is accordingly less likely that imprinted marks are caused during storage of rolled die-sorting sheets.

Figure 3:
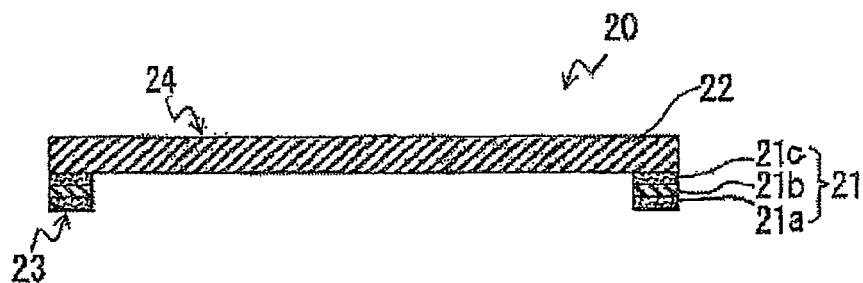
FIG. 3 is a cross sectional view of a die-sorting sheet according to the present invention.
Figure 11:
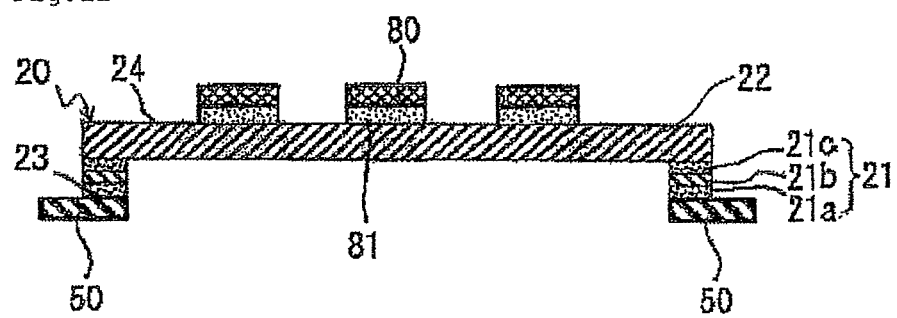
FIG. 11 is a view for explaining a method for transporting a chip having an adhesive layer according to the present invention.

FIG. 3 shows another embodiment that corresponds to a reversed structure of the die-sorting sheet 10 of FIG. 2. In a die-sorting sheet 20 illustrated in the figure, a pressure-sensitive adhesive layer 21 is laminated on the under surface of a base film 22. In detail, the pressure-sensitive adhesive layer 21 is exposed on outer periphery 23 of the under surface of the die-sorting sheet 20, and the base film 22 is exposed on a central area 24 of the upper surface of the die-sorting sheet (FIG. 3). In this case, a semiconductor chip 80 is temporarily attached and accommodated on the upper surface of the base film 22 as will be described later (FIG. 11).

The pressure-sensitive adhesive layer 21 is a double-sided pressure-sensitive adhesive sheet wherein pressure-sensitive adhesive layers 21a and 21c are provided on both surfaces of a core film 21b. Similar to the pressure-sensitive adhesive layer in the die-sorting sheet 10, the pressure-sensitive adhesive layer has such a size that it may be fixed to a ring frame 50 used in the transporting methods of the present invention. The core film 21b is similar to that in the core film 11b, and the pressure-sensitive adhesive layers 21a and 21c are similar to the pressure-sensitive adhesive layers 11a and 11c.

In the die-sorting sheets 20, the surface on which chips are temporarily attached is different from the surface on which the pressure-sensitive adhesive layer for the fixing to the ring frame is provided. It is therefore possible to optimally control the keying (interlayer adhesion) between the pressure-sensitive adhesive layer 21 and the base film 22, and surface properties required for the temporary attaching of chips.

Figure 4:
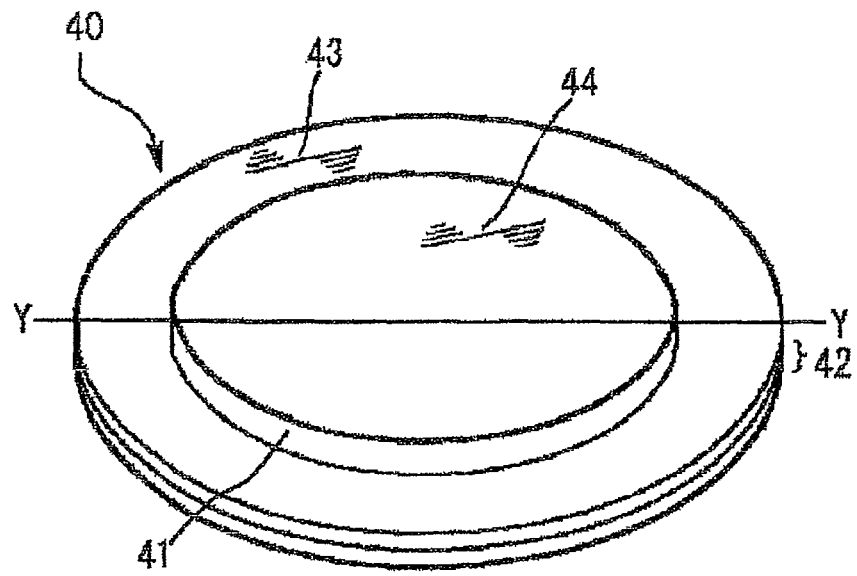
FIG. 4 is a perspective view of a die-sorting sheet of the present invention.
Figure 5:
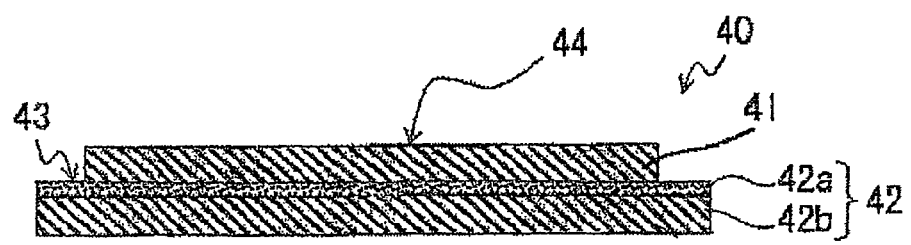
FIG. 5 is a cross sectional view taken on line Y-Y of FIG. 4.

Another preferred embodiment of the die-sorting sheets is illustrated in a perspective view and a cross sectional view in FIGS. 4 and 5, respectively, wherein a die-sorting sheet 40 is a laminate in which a support film 42b is laminated with a pressure-sensitive adhesive layer 42a that is shaped identically with the support film, and a base film 41 is laminated on a central area of the pressure-sensitive adhesive layer. The pressure-sensitive adhesive layer 42a is exposed on an outer periphery 43 of the die-sorting sheet 40, and the base film 41 is exposed on a central area 44 that is inside the outer periphery. It is preferable structure that is similar to the laminate order of the structure shown in FIG. 5, the pressure-sensitive adhesive layer 42a and the base film 41 may have larger diameters than the support film 42b and the pressure-sensitive adhesive layer 42a may be exposed on an outer periphery of the under surface of the base film 41.

A general dicing tape 42 may be used as a unit of the support film 42b and the pressure-sensitive adhesive layer 42a, but the scope of the invention is not limited thereto.

The base film 41 and the support film 42b may be appropriately selected from the resin films described with respect to the base film 12. The thickness of the base film 41 is preferably 1 to 200 μm, and more preferably 5 to 100 μm, and the thickness of the support film 42b is preferably 10 to 500 μm, and more preferably 30 to 300 μm. The surface tension on the surface of the base film 41 on which chips will be mounted is the same as that of the base film 12.

The pressure-sensitive adhesive layer 42a may be formed from a pressure-sensitive adhesive similar to that of the pressure-sensitive adhesive layer 11a. The thickness of the pressure-sensitive adhesive layer 42a is preferably 1 to 100 μm, and more preferably 3 to 80 μm.

The pressure-sensitive adhesive layer 42a has such a size that an exposed portion thereof is large enough to be attached to the ring frame 50. In detail, the exposed portion of the pressure-sensitive adhesive layer 42a should have such a size that the pressure-sensitive adhesive layer 42a may be fixed to a planned surface 53 of the ring frame 50 that is to be attached to the die-sorting sheet. In more detail, the outer diameter of the pressure-sensitive adhesive layer 42a should be larger than the diameter of the opening 51. The base film 41 on which semiconductor chips will be temporarily attached is somewhat smaller than the inner diameter of the opening 51 of the ring frame 50.

The production of the die-sorting sheet 40 starts with providing a pressure-sensitive adhesive sheet that has a support film 42b and a pressure-sensitive adhesive layer 42a. A base film 41 cut to a predetermined shape is attached on the pressure-sensitive adhesive layer 42a. A release film is disposed to cover the surfaces of the base film 41 and the pressure-sensitive adhesive layer 42a. Thereafter, the support film 42b and the pressure-sensitive adhesive layer 42a are punched from the support film 42b into a predetermined profile while avoiding punching out the release film.

Alternatively, a die-sorting sheet 40 may be fabricated as follows. Abase film 41 is laminated on a pressure-sensitive adhesive layer 42a of a pressure-sensitive adhesive sheet that has a support film 42b and the pressure-sensitive adhesive layer 42a. The base film 41 is punched to a predetermined shape and an outer peripheral portion thereof is removed while avoiding punching out the pressure-sensitive adhesive layer 42a. A release film is disposed and the laminate is punched out to a predetermined profile in the same manner as described above.

[Methods for Transporting Chips with Adhesive Layer]

The methods for transporting chips having an adhesive layer according to the present invention will be described hereinbelow based on embodiments wherein the substrate is a semiconductor wafer. That is, the methods described below address the transporting of semiconductor chips having an adhesive layer. The transporting methods of the present invention are not limited to the transportation of semiconductor wafers and may be used for other substrates such as glass substrates. In the following embodiments, the die-sorting sheets are die-sorting sheets 10 as illustrated in FIG. 2. In the methods for transporting chips having an adhesive layer according to the present invention, however, any of the die-sorting sheets as described above may be used.

In a method for transporting a semiconductor chip having an adhesive layer, a dicing and die-bonding adhesive sheet that has an adhesive layer and a base material is applied to a back surface of a semiconductor wafer.

The semiconductor wafer is then full-cut diced with respect to chips together with the adhesive layer.

A semiconductor chip having the adhesive layer on the back surface thereof is picked up from the base material.

Figure 7:
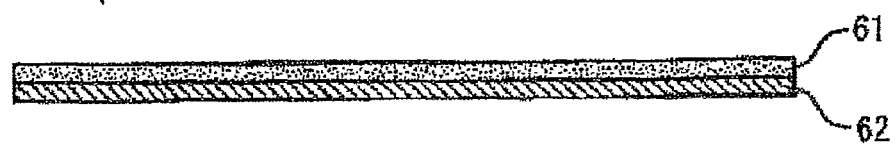
FIG. 7 is a view for explaining a method for transporting a chip having an adhesive layer according to the present invention.

In detail, as shown in FIG. 7, a dicing and die-bonding adhesive sheet 60 having an adhesive layer 61 and a base material 62 is provided. In the dicing and die-bonding adhesive sheet 60, the adhesive layer 61 is releasably laminated on the base material 62. To protect the adhesive layer 61, a release film may be disposed on the upper surface of the adhesive layer 61 until the adhesive sheet is used. The release films may be general release films such as polyethylene terephthalate films that are release treated with releasing agents such as silicone resins.

The dicing and die-bonding adhesive sheet 60 may be produced by any methods without limitation. For example, a composition for forming an adhesive layer 61 may be applied and dried on a base material 62. Alternatively, an adhesive layer 61 may be formed on a release film and may be transferred onto a base material 62. An outer peripheral portion of the surface of the adhesive layer 61 may be provided with a ring frame-fixing pressure-sensitive adhesive sheet to immobilize a ring frame.

Figure 8:
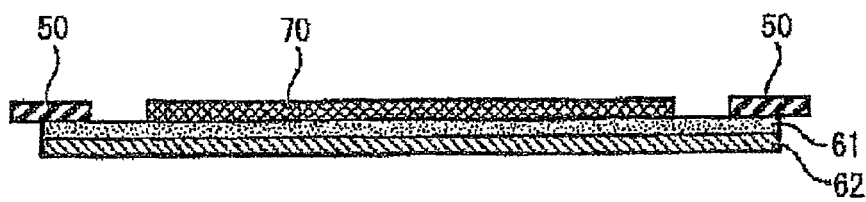
FIG. 8 is a view for explaining a method for transporting a chip having an adhesive layer according to the present invention.

Thereafter, as shown in FIG. 8, the dicing and die-bonding adhesive sheet 60 is fixed on a dicing apparatus via a ring frame 50; a surface of a semiconductor wafer 70 is placed on the adhesive layer 61 of the dicing and die-bonding adhesive sheet 60, and the semiconductor wafer 70 is fixed thereto by light pressing against the adhesive layer.

In the case where the adhesive layer 61 has energy ray curability, an energy ray is applied through the base material 62 and thereby the cohesion of the adhesive layer 61 is increased to lower the adhesion between the adhesive layer 61 and the base material 62. The energy ray may be applied after dicing or after the expanding step described below.

Figure 9:
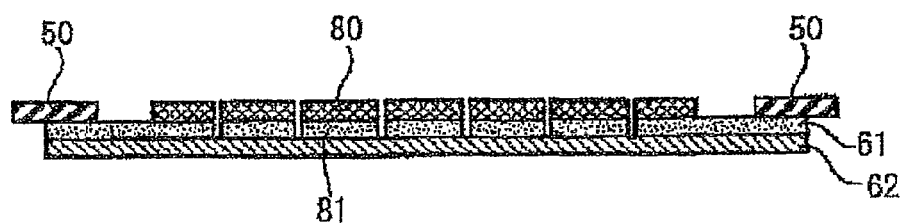
FIG. 9 is a view for explaining a method for transporting a chip having an adhesive layer according to the present invention.

Thereafter, as shown in FIG. 9, the semiconductor wafer 70 is cut with respect to circuits by cutting means such as a dicing saw, and semiconductor chips 80 are obtained. The cutting is effected to an appropriate depth in consideration of the total thickness of the semiconductor wafer 70 and adhesive layer 61 and the abrasion of the dicing saw, while ensuring that the semiconductor wafer 70 and the adhesive layer 61 are cut completely.

Subsequently, the dicing and die-bonding adhesive sheet 60 may be expanded as required, whereby the distance between neighboring semiconductor chips is increased to further facilitate the picking up of the semiconductor chips 80. The expansion causes the adhesive layer 61 and the base material 62 to slide past each other, and the adhesion between the adhesive layer 61 and the base material 62 is reduced to permit the semiconductor chips 80 to be picked up easily.

Figure 9A:
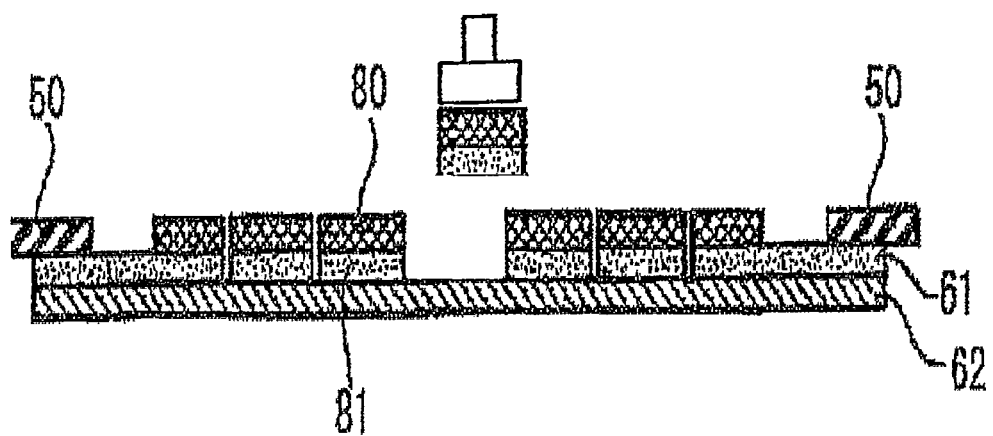
FIG. 9a is a view showing a die having an adhesive layer on the back surface thereof being picked up from the base material according to the present invention.

As shown in FIG. 9a, by picking up the semiconductor chips 80, the separated adhesive layer 81 is separated from the base material 62 and remains attached to the back surface of the semiconductor chips 80. That is, the semiconductor chips 80 are picked up while Having the adhesive layer 81 on the back surface thereof.

Thereafter, a die-sorting sheet 10 is provided in another process to the above which is fixed to a ring frame 50 through a pressure-sensitive adhesive layer 11 on an outer periphery 13.

Next, the semiconductor chips 80 that are picked up are temporarily attached through the adhesive layer 81 onto a base film 12 exposed on a central area 14 of the die-sorting sheet 10 (FIG. 10). A usual die-bonding apparatus may be used to temporarily attach the semiconductor chips. The adhesive layer 81 has tackiness such that the chips can be die-bonded. Accordingly, the semiconductor chips 80 that are (temporarily) attached to the base film 12 exposed on the die-sorting sheet 10 will be prevented from dropping off. If the temporary attaching is unstable, it may be stabilized by controlling temporary attaching conditions (e.g., temperature, pressure). According to the present invention, any number of semiconductor chips 80 may be temporarily attached and accommodated, and therefore desired numbers of semiconductor chips may be transported to different places. The semiconductor chips 80 are temporarily attached to the base film 12 exposed on the die-sorting sheet 10, and are therefore stably accommodated and transported.

Figure 13:
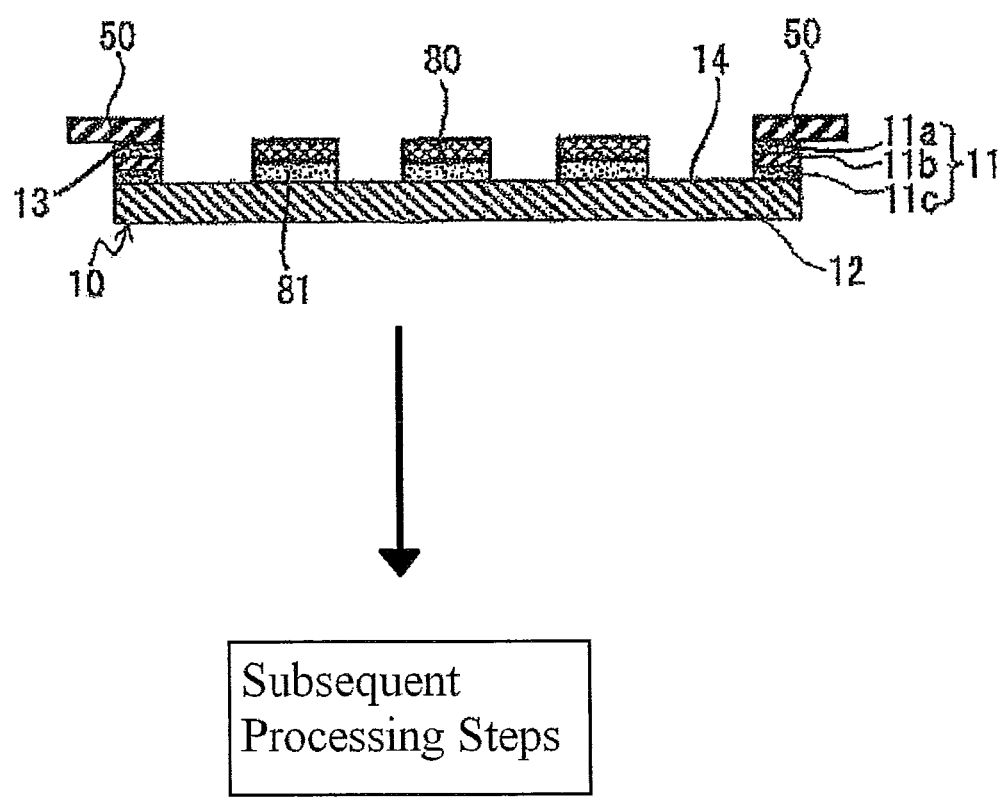
FIG. 13 is a view showing the die-sorting sheet being transported to a subsequent processing step while a chip is temporarily attached on the sheet through the adhesive layer according to the present invention.

Next, as shown in FIG. 13, the die-sorting sheet 10 is transported to a subsequent step while the semiconductor chips 80 are temporarily attached on the sheet through the adhesive layer 81.

The subsequent steps include a die-bonding step. Unlike pressure-sensitive adhesive tapes such as general dicing tapes, the sheets according to the present invention do not have any pressure-sensitive adhesive layer in a region where chips are accommodated. Accordingly, even the semiconductor chips 80 having the adhesive layer 81 on the back surface may be easily picked up in the die-bonding step without the adhesive layer 81 being deformed. Furthermore, the adhesive layer 81 is prevented from any contamination with a pressure-sensitive adhesive of a pressure-sensitive adhesive tape, and therefore highly reliable semiconductor devices may be manufactured.

Figure 12:
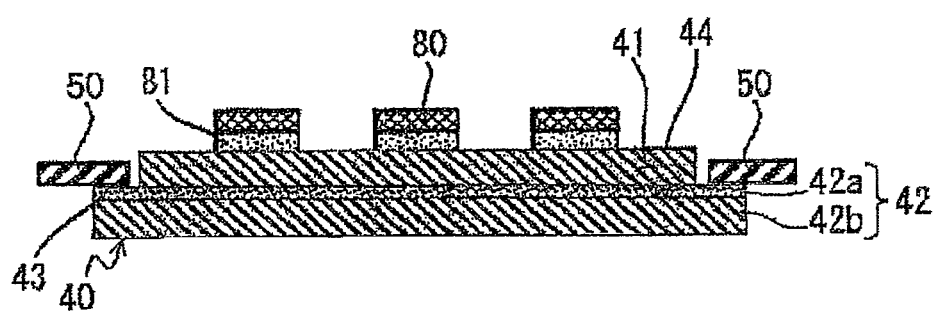
FIG. 12 is a view for explaining a method for transporting a chip having an adhesive layer according to the present invention.

The die-sorting sheets are not limited to the die-sorting sheets 10, and the die-sorting sheets 20 and 40 may be used. In the use of the die-sorting sheet 20 as illustrated in FIG. 11, the sheet is fixed to the ring frame 50 through the pressure-sensitive adhesive layer 21 on the outer periphery 23, and the semiconductor chips 80 that are picked up are temporarily attached to the base film 22 exposed on the central area 24 of the die-sorting sheet 20 and are transported to the subsequent step. In the use of the die-sorting sheet 40 as illustrated in FIG. 12, the sheet is fixed to the ring frame 50 through the pressure-sensitive adhesive layer 42a at the outer periphery 43, and the semiconductor chips 80 that are picked up are temporarily attached to the base film 41 exposed on the central area 44 of the die-sorting sheet 40 and are transported to the subsequent step.

In another embodiment, an inspection process in which a performance of the semiconductor chips 80 is tested may be carried out before the semiconductor chips 80 are temporarily attached to the die-sorting sheet. In this embodiment, semiconductor chips 80 that are verified to be non-defective may be only picked up together with the adhesive layer 81 and be temporarily attached and accommodated on the die-sorting sheet, whereby the non-defective chips may be selectively transported to the subsequent steps.

In a still another embodiment, a plurality of the semiconductor chips 80 that are picked up may be temporarily attached to the base film 12 exposed on the die-sorting sheet 10 so that the respective adhesive layers 81 are separate from one another with a distance such that a chip-detecting camera of a pick-up device can identify each chip. In this case, it is not necessary to carry out the expanding step for separating the chips, and the chips can be next picked up more easily. The distance between neighboring chips depends on the chip size and the precision or magnification of the camera, but is preferably about 50 μm to 1 mm.

In the subsequent steps, a cleaning step may be performed prior to the die-bonding step or the like in order to remove dusts (contamination) attached during the accommodation or transportation. Since the semiconductor chips 80 are temporarily attached to the die-sorting sheet 10 in the present invention, the chips may be cleaned as they are.

EXAMPLES

The present invention will be described based on Examples hereinbelow without limiting the scope of the invention.

Example 1

[Production of Die-sorting Sheet]

100 Parts by weight of an acrylic copolymer based on butyl acrylate (COPONYL N-3327 manufactured by Nippon Synthetic Chemical Industry Co., Ltd.) was mixed with 2 parts of an aromatic polyisocyanate (CORONATE L manufactured by NIPPON POLYURETHANE INDUSTRY CO., LTD.) and 50 parts of toluene to give a pressure-sensitive adhesive solution (a).

100 Parts by weight of an acrylic copolymer based on butyl acrylate (SN Dyne 1811 L manufactured by Soken Chemical & Engineering Co., Ltd.) was mixed with 5 parts of an aromatic polyisocyanate (TD-75 manufactured by Soken Chemical & Engineering Co., Ltd.) and 30 parts of toluene to give a pressure-sensitive adhesive solution (b).

The pressure-sensitive adhesive solution (a) was applied to a silicone-treated release film (SP-PET 3811 (S) manufactured by LINTEC CORPORATION) and was dried (in an oven at 100° C. for 1 minute) to form a pressure-sensitive adhesive layer A in a thickness of 10 μm. The pressure-sensitive adhesive solution (b) was applied to a similar release film and treated as described above to form a pressure-sensitive adhesive layer B in a thickness of 10 μm.

A core film was an ethylene/methacrylic acid copolymer film (thickness: 90 μm). The pressure-sensitive adhesive layer A was transferred to a surface of the core film, and the pressure-sensitive adhesive layer 13 was transferred to the other surface, thereby preparing a double-sided pressure-sensitive adhesive sheet. The double-sided pressure-sensitive adhesive sheet was punched to remove an inner area thereof 165 mm in diameter.

A base film was a low-density polyethylene film (thickness: 100 μm, surface tensions: 31 mN/m and 40 mN/m). The pressure-sensitive adhesive layer B of the double-sided pressure-sensitive adhesive sheet was attached to the lower surface tension side of the base film. The laminate was then punched to remove an outer area larger than a diameter of 207 mm. Here, the outer area was punched out concentrically with the inner circular part that had been created by the punching out of the inner area. The resultant die-sorting sheet was as illustrated in FIG. 2.

[Transportation of Semiconductor Chips]

A semiconductor wafer (a dummy wafer, diameter: 200 mm) was attached to a dicing and die-bonding adhesive sheet having a tacky adhesive layer (Adwill LE 5000 manufactured by LINTEC CORPORATION). The wafer was diced together with the adhesive layer, and semiconductor chips (5 mm×5 mm) having an adhesive layer on the back surface were prepared. The semiconductor chips with an adhesive layer were picked up with a die-bonding apparatus. Separately, the die-sorting sheet was fixed to a ring frame through the pressure-sensitive adhesive layer on the outer periphery. The semiconductor chips that were picked up were temporarily attached through the adhesive layer to the base film exposed on the die-sorting sheet (FIG. 10) A total of one hundred (100) semiconductor chips were temporarily attached in lattice patterns with a distance of about 300 μm between neighboring chips.

The chips were then stored at 25° C. for 12 hours and were cleaned with water by use of a spin washer (a unit built in wafer grinding device; DFD 651 manufactured by DISCO Corporation) at 3000 rpm for 1 minute. The chips were inspected to find if any chips had dropped. Thereafter, ten (10) semiconductor chips with the adhesive layer were picked up from the die-sorting sheet by use of a die-bonding apparatus and with the lifting by four needles. The picking up was evaluated as a failure if the suction collet could not hold the semiconductor chip and the chip remained on the die-sorting sheet or fell, and the number of pick-up failures was counted. Further, any separation of the die-sorting sheet from the ring frame was checked during the operations from the temporary attaching to the picking up. The results are shown in Table 1.

Example 2

A die-sorting sheet was prepared in the same manner as in Example 1 except that the base film was an ethylene/methyl methacrylate copolymer film (thickness: 80 µm, surface tensions: 33 mN/m and 40 mN/m).

Semiconductor chips were transported and the evaluations such as chip dropping were carried out in the same manner as in Example 1 except that the die-sorting sheet obtained above was used. The results are shown in Table 1.

Example 3

A die-sorting sheet of the type as illustrated in FIG. 2 was prepared in the same manner as in Example 1 except that the double-sided pressure-sensitive adhesive sheet was attached to the higher surface tension side of the base film.

Semiconductor chips were transported and the evaluations such as chip dropping were carried out in the same manner as in Example 1 except that the die-sorting sheet obtained above was used. The results are shown in Table 1.

Example 4

The pressure-sensitive adhesive solution (a) was applied to a silicone-treated release film (SP-PET 3811 (S) manufactured by LINTEC CORPORATION) and was dried (in an oven at 100° C. for 1 minute) to form a pressure-sensitive adhesive layer A in a thickness of 10 µm. A support film was an ethylene/methacrylic acid copolymer film (thickness: 90 µm). The pressure-sensitive adhesive layer A was transferred to a surface of the support film to give a pressure-sensitive adhesive tape.

A base film was an ethylene/methyl methacrylate copolymer film (thickness: 100 µm, surface tensions: 33 mN/m and 40 mN/m). The pressure-sensitive adhesive layer A of the pressure-sensitive adhesive tape was attached to the higher surface tension side of the base film. The base film alone was selectively punched to remove an outer peripheral portion thereof larger than a diameter of 165 mm. Subsequently, a release film was disposed on the exposed pressure-sensitive adhesive layer A and the base film. The support film and the pressure-sensitive adhesive layer A were punched to remove outer areas thereof larger than a diameter of 207 mm. Here, the outer areas were punched out concentrically with the inner circular part that had been created by the punching out of the outer peripheral portion. The resultant die-sorting sheet was as illustrated in FIG. 5.

Semiconductor chips were transported (FIG. 11) and the evaluations such as chip dropping were carried out in the same manner as in Example 1 except that the die-sorting sheet obtained above was used. The results are shown in Table 1.

Comparative Example 1

Semiconductor chips were transported in the same manner as in Example 1 except that the die-sorting sheet was replaced by a general removable and rebondable dicing tape (Adwill G-19 manufactured by LINTEC CORPORATION).

The evaluations such as chip dropping were carried out in the same manner as in Example 1. The results are shown in Table 1.

Comparative Example 2

Instead of the die-sorting sheet, a general UV-curable pressure-sensitive adhesive dicing tape (Adwill D-175 manufactured by LINTEC CORPORATION) was attached to the ring frame and the pressure-sensitive adhesive layer was cured with UV rays.

Semiconductor chips were transported and the evaluations such as chip dropping were carried out in the same manner as in Example 1 except that the UV-cured general dicing tape was used. The results are shown in Table 1.

TABLE 1

|  | Chip dropping | Pick-up failures | Separation from ring frame |
| --- | --- | --- | --- |
| Ex. 1 | None | 0/10 | No |
| Ex. 2 | None | 0/10 | No |
| Ex. 3 | None | 0/10 | No |
| Ex. 4 | None | 0/10 | No |
| Comp. Ex. 1 | None | 10/10 | No |
| Comp. Ex. 2 | None | 8/10 | Partial separation |

The invention claimed is:

1. A die-sorting sheet on which each chip having an adhesive layer is temporarily attached, which die-sorting sheet comprises a pressure-sensitive adhesive layer for fixing a ring frame and a base film for temporarily attaching each chip having the adhesive layer,
   wherein the pressure-sensitive adhesive layer is laminated on an outer periphery of the base film and exposed on an outer periphery of the die-sorting sheet,
   wherein only the base film is exposed on a central area that is inside the outer periphery of the die-sorting sheet,
   wherein the base film is not a pressure-sensitive adhesive layer and has no energy ray curability, and
   wherein the base film is at least one resin film selected from the group consisting of polyethylene film, polypropylene film, polyvinyl chloride film, ethylene/vinyl acetate copolymer film, ethylene/(meth)acrylic acid copolymer film, ethylene/(meth)acrylate copolymer film, polyethylene terephthalate film and polyurethane film.

2. A die-sorting sheet for temporarily attaching each chip having an adhesive layer, which die-sorting sheet comprises a pressure-sensitive adhesive layer for fixing a ring frame, a base film for temporarily attaching each chip having the adhesive layer, and a support film,
   wherein the pressure-sensitive adhesive layer is laminated on the support film, is shaped identically with the support film, and is exposed on an outer periphery of the die-sorting sheet,
   wherein the base film is laminated on a central area of the pressure-sensitive adhesive layer that is inside the outer periphery of the die-sorting sheet and only the base film is exposed on the central area, wherein the base film is not a pressure-sensitive adhesive layer and has no energy ray curability, and wherein the base film is at least one resin film selected from the group consisting of polyethylene film, polypropylene film, polyvinyl chloride film, ethylene/vinyl acetate copolymer film, ethylene/(meth)acrylic acid copolymer film, ethylene/(meth)acrylate copolymer film, polyethylene terephthalate film and polyurethane film.

3. A method for transporting a chip, which method comprises:

applying a dicing and die-bonding adhesive sheet to a surface of a substrate, the adhesive sheet comprising an adhesive layer and a base material;

full-cut dicing the substrate with respect to chips together with the adhesive layer;

picking up one of the chips having the adhesive layer on a back surface thereof from the base material;

providing the die-sorting sheet of claim 1 that is fixed with a frame through the pressure-sensitive adhesive layer on the outer periphery;

temporarily attaching the picked-up chip through the adhesive layer thereof onto the base film exposed on the die-sorting sheet; and transporting the die-sorting sheet to a subsequent step while the chip is temporarily attached on the die-sorting sheet through the adhesive layer.

4. The method according to claim 3, wherein a plurality of the chips each having the adhesive layer on the back surface thereof are temporarily-attached to the base film exposed on the die-sorting sheet, wherein the adhesive layers of the respective chips are separate from one another.

5. A method for transporting a chip, which method comprises:

applying a dicing and die-bonding adhesive sheet to a surface of a substrate, the adhesive sheet comprising an adhesive layer and a base material;

full-cut dicing the substrate with respect to chips together with the adhesive layer;

picking up one of the chips having the adhesive layer on a back surface thereof from the base material;

providing the die-sorting sheet of claim 2 that is fixed with a frame through the pressure-sensitive adhesive layer on the outer periphery;

temporarily attaching the picked-up chip through the adhesive layer thereof onto the base film exposed on the die-sorting sheet; and transporting the die-sorting sheet to a subsequent step while the chip is temporarily attached on the die-sorting sheet through the adhesive layer.

6. The die-sorting sheet according to claim 1, wherein a surface tension on a surface of the base film on which chips will be mounted is not more than 40 mN/m.

7. The die-sorting sheet according to claim 2, wherein a surface tension on a surface of the base film on which chips will be mounted is not more than 40 mN/m.

8. The method according to claim 3, wherein a surface tension on a surface of the base film on which chips will be mounted is not more than 40 mN/m.

9. The method according to claim 5, wherein a surface tension on a surface of the base film on which chips will be mounted is not more than 40 mN/m.

10. The die-sorting sheet according to claim 6, wherein a surface of the base film on which chips will be mounted is release-treated.

11. The die-sorting sheet according to claim 7, wherein a surface of the base film on which chips will be mounted is release-treated.

12. The method according to claim 8, wherein a surface of the base film on which chips will be mounted is release-treated.

13. The method according to claim 9, wherein a surface of the base film on which chips will be mounted is release-treated.

* * * * *

UNITED STATES PATENT AND TRADEMARK OFFICE
CERTIFICATE OF CORRECTION

| | | |
|---|---|---|
| PATENT NO. | : 8,587,130 B2 | Page 1 of 1 |
| APPLICATION NO. | : 12/446117 | |
| DATED | : November 19, 2013 | |
| INVENTOR(S) | : Akie Hamasaki et al. | |

It is certified that error appears in the above-identified patent and that said Letters Patent is hereby corrected as shown below:

In the Claims

Column 13, Line 31, Claim 4, "temporarily-attached" should read -- temporarily attached --

Signed and Sealed this
Eleventh Day of March, 2014

Michelle K. Lee
*Deputy Director of the United States Patent and Trademark Office*